United States Patent
Yang

(10) Patent No.: US 6,169,029 B1
(45) Date of Patent: Jan. 2, 2001

(54) METHOD OF SOLVING METAL STRINGER PROBLEM WHICH IS INDUCED BY THE PRODUCT OF TIN AND ORGANIC ARC REACTION

(75) Inventor: Ching-Sheng Yang, Hsinchu (TW)

(73) Assignee: Winband Electronics Corp., Hsinchu (TW)

(*) Notice: Under 35 U.S.C. 154(b), the term of this patent shall be extended for 0 days.

(21) Appl. No.: 09/304,472

(22) Filed: May 3, 1999

(51) Int. Cl.$^7$ .................... H01L 21/4763; H01L 21/44; G03C 5/00

(52) U.S. Cl. .................. 438/671; 438/636; 438/669; 430/318

(58) Field of Search .................. 438/636, 669–671, 438/725, 735, 736; 430/311–318

(56) References Cited

U.S. PATENT DOCUMENTS

| | | | |
|---|---|---|---|
| 5,670,298 | * 9/1997 | Hur | 430/318 |
| 5,760,483 | * 6/1998 | Bruce et al. | 257/797 |
| 5,767,013 | * 6/1998 | Park et al. | 438/622 |
| 6,013,582 | * 1/2000 | Ionov et al. | 438/738 |
| 6,080,529 | * 6/2000 | Ye et al. | 430/318 |

* cited by examiner

Primary Examiner—John F. Niebling
Assistant Examiner—Ha Tran Nguyen
(74) Attorney, Agent, or Firm—W. Wayne Liauh

(57) ABSTRACT

A process for fabricating a sub-micron or deep sub-micron semiconductor device on a wafer surface with an improved anti-reflective coating is disclosed. It includes the steps of: (a) depositing an aluminum layer on a wafer surface; (b) depositing an inorganic anti-reflective layer TiN on top of the aluminum layer; (c) depositing a dielectric partitioning layer, typically a polymer layer, on top of the TiN layer; (d) depositing an organic anti-reflective layer on the dielectric partitioning layer; (e) depositing a photoresist on the organic anti-reflective layer; (f) performing a photolithography process to form a photoresist pattern using a deep UV technology in conjunction with a photomask; (g) removing the organic anti-reflective the and the dielectric partitioning layer not covered by the photoresist using an oxide etcher; and (h) removing the TiN layer and the metal layer also not covered by the photoresist using a metal etcher. This process eliminates the formation of an oxidized composition that can be formed at the interface between the TiN layer and the organic anti-reflective layer which can cause a decrease in production yield.

15 Claims, 2 Drawing Sheets

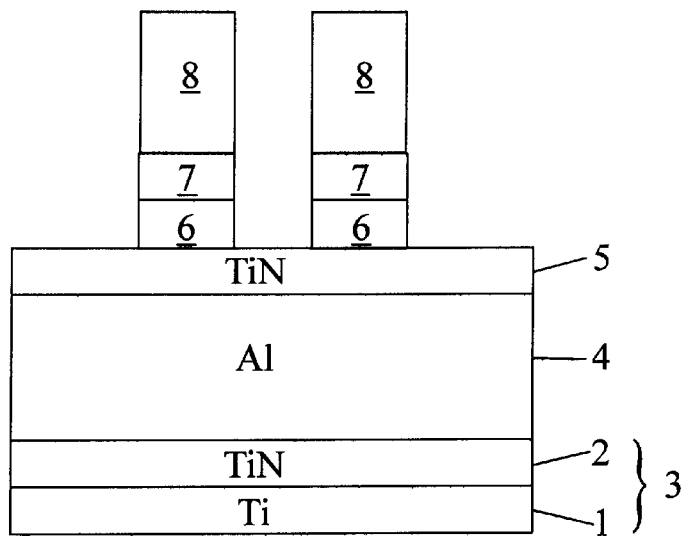
Fig. 4
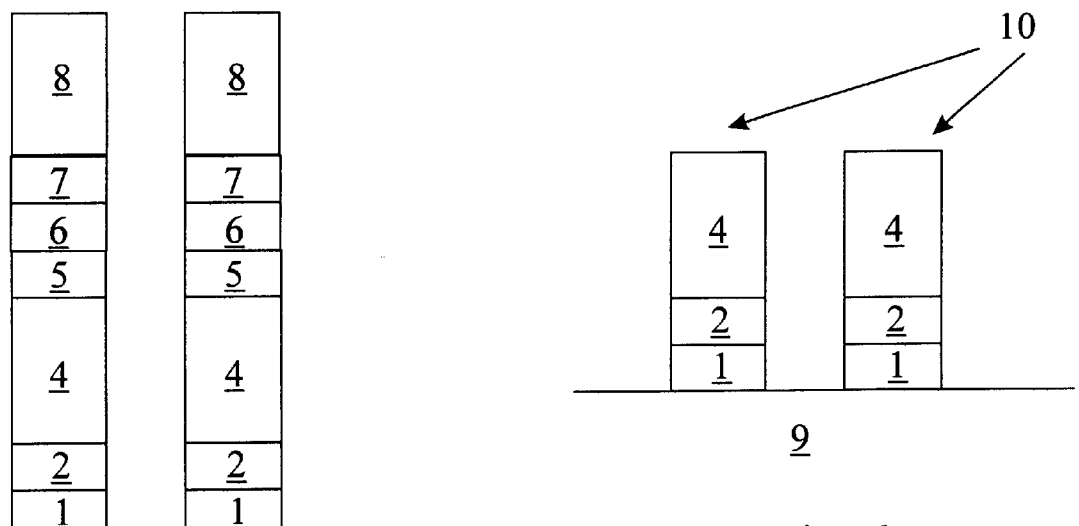
Fig. 5
Fig. 6

METHOD OF SOLVING METAL STRINGER PROBLEM WHICH IS INDUCED BY THE PRODUCT OF TIN AND ORGANIC ARC REACTION

FIELD OF THE INVENTION

The present invention relates to a method for providing an improved anti-reflective coating (ARC) layer during the fabrication of sub-micron or deep-sub-micron semiconductor devices utilizing the deep UV technology. More specifically, the present invention relates to an improved method which solves the often-encountered low production yield problem when an inorganic ARC, such as TiN, and an organic ARC are both used to form a combined anti-reflective coating above a metal layer during the fabrication of sub-micron and/or deep-sub-micron semiconductor devices. The method disclosed in the present invention allows a more precise image transfer of the photoresist onto the metal layer so as to allow a further reduction of the critical dimension of the metal pattern, without incurring the penalty of reduction in production yield.

BACKGROUND OF THE INVENTION

During the fabrication of semiconductor devices, an inorganic anti-reflective coating (ARC) such as TiN is often deposited on top of a metal layer. By providing an anti-reflective coating, less light is reflected back through the photoresist and toward the photomask. As a result, the photoresist can be more precisely patterned on the metal layer with the additional step of providing the TiN anti-reflective layer.

The need for precise patterning of photoresists becomes even more critical for the fabrication of sub-micron and/or deep-sub-micron semiconductor devices, especially in the formations of shallow trench isolations (STI), poly gates, etc. which involve the deep UV technology to satisfy the ever-decreasing critical dimension of semiconductor devices. More recently, the deep UV technology is also commonly used in forming metal layers, allowing the metal conducting lines to assume an even smaller critical dimension. When the deep sub-micron technology now moves from 0.25 $\mu$m, 0.20 $\mu$m, to 0.18 $\mu$m and even smaller geometry, the need for a more precise patterning technology, and, thus, an improved anti-reflective coating technology, cannot be overstated.

In the fabrication of the metal layer, typically a combined Ti and TiN layer is sputtered to serve as a barrier layer. Then an aluminum layer is sputtered on the barrier layer. Finally, a TiN layer is sputtered on the metal layer to form the top anti-reflective coating. It has been observed that $NH_3$ is often generated during the deposition of the TiN layer. The $NH_3$ gas, which is basic in nature (i.e., pH>7), can react with the acidic material which may be released during the deep UV exposure of the photoresist layer. As a result, the so-called "bottom foot" can be formed at the bottom face of the photoresist, causing the formation of an irregular critical dimension profile.

To ameliorate this problem, an organic anti-reflective coating can be coated on top of the TiN layer so as to prevent the direct contact of the $NH_3$ gas with the photoresist. The provision of the additional layer of organic anti-reflective coating can also prevent the generation of standing waves and enlarge the process window of the underlying lithography process.

However, the addition of the organic anti-reflective coating on top of the TiN coating appears to cause another type of problem, in that the occurrence of the incidents of metal line shorting is observed to have increased, thus causing the wafer yield to be reduced. The use of inorganic and/or organic anti-reflective coatings is well-known in the art. The following most recent U.S. patents are cited to provide useful background information.

U.S. Pat. No. 5,760,483 discloses methods to enhance the contrast between alignment targets and adjacent materials on a semiconductor. In one embodiment, the TiN layer that is deposited during earlier processing step is tripped away to enhance the reflectivity of the metal layer. The contrast between the alignment target and the adjacent material that is more consistent over variations in oxide thickness. The more uniform contrast makes it easier for the stepper system to identify the edges of the alignment target, resulting in a more exact placement of the mask.

U.S. Pat. No. 5,670,298 discloses a method to form a metal pattern on a substrate. It mentions the use of an anti-reflective coating to restrain the notching phenomenon which may occur when carrying out a photolithography process for forming a metal pattern. While there is widely used an inorganic anti-reflective coating process which reduces the light reflection of metal film formed under the photoresist pattern, an organic anti-reflective coating which uses a polymer as a coating material may also be used.

U.S. Pat. No. 5,767,013 discloses a method for forming an interconnection pattern in a semiconductor device for reducing metallic reflection without requiring an anti-reflective coating. The method includes the steps of forming a conductive layer on a substrate, polishing the conductive layer to form a rugged surface on the conductive layer, and selectively removing the polished conductive layer to form the interconnection. The '013 patent mentioned that for an anti-reflective coating, the inorganic process uses TiN, $SiN_4$, and TiW as inorganic film, whereas the organic process uses polymer as organic film. The '013 patent also mentioned the difficulty in controlling etch selectivity for the ARC film and the metal film, and overetching of the metal film can often occur, causing formation of unnecessary gaps in a planarizing film formed thereon.

At the present time, it is not known why a combination of the organic and inorganic anti-reflective coatings would cause the production yield to suffer. In light of the several advantages of using the combined organic and inorganic anti-reflective coatings, it is highly desirable to develop a method that will overcome the prior art problem and allow a more precise patterning of the photoresist to be achieved for the sub-micron and deep submicron processes which utilize the deep UV technology.

SUMMARY OF THE INVENTION

The primary object of the present invention is to develop a method that will allow precise patterning of photoresist to be achieved in conjunction with the use of the deep UV technology without suffering reductions in the production yield. More specifically, the primary object of the present invention is to develop a method which will allow an anti-reflective coating layer to contain both an organic anti-reflective film and an inorganic anti-reflective film, more particularly a TiN film, so as to enjoy the advantages of the combined anti-reflective coating while eliminating the production yield problems that may be associated therewith, during the fabrication of sub-micron or deep sub-micron semiconductor devices.

After careful examination of the combined organic and inorganic anti-reflective coatings that have been provided on a metal layer, it was discovered by the inventor of the present invention, that an oxidized composition can be formed between the organic anti-reflective film and the inorganic anti-reflective film when the two different types of films were formed adjacent to each other. It was also found that the oxidized composition so formed cannot be easily etched away by the conventional oxide etcher or a metal etcher. As a result, a metal stringer can be formed from the metal line, causing the metal line to short and the production yield to drop, sometimes precipitously.

In the process disclosed in the present invention, a partitioning layer is formed on top of the inorganic anti-reflective film prior to the deposition of the organic anti-reflective film. The partitioning layer, which can be easily removed by an oxide etcher or metal etcher, serves to isolate the organic anti-reflective film from being in direct contact with the inorganic anti-reflective film. Unexpected results were observed in that production yield can be substantially improved by the implementation of the process disclosed in the present invention. The formation of such a partitioning layer between the two types of anti-reflective films effectively prevents the formation of the inter-film oxide layer and thus eliminates the metal stringer formation problem experienced during the application of the deep UV technology. The partitioning layer can be a silicon dioxide or a polymer layer which is different from the organic anti-reflective film.

The method disclosed in the present invention is typically incorporated in a deep UV process that includes the following steps:

(a) Depositing a barrier layer, which includes a Ti sub-layer and a TiN sub-layer;

(b) Depositing a metal layer, typically an Al layer;

(c) Depositing an inorganic anti-reflective layer, typically a TiN layer, on top of the aluminum layer;

(d) Depositing a partitioning film on top of the TiN layer;

(e) Depositing an organic anti-reflective film on the partitioning film;

(f) Depositing a photoresist on the organic anti-reflective film;

(g) Performing an image transfer using a deep UV technology in conjunction with a photomask;

(h) Using a reactive-ion etching (RIE) technique and an oxide etcher to etch the organic film and the partitioning film;

(i) Using a reactive ion etching technique and a metal etcher to etch the TiN and the metal layer; and (j) Removing all the layers above the metal layer to show a metal pattern.

A wide selection of materials can be used as the partitioning layer. The preferred examples are polymers, such as polyimides, which do not react with the inorganic anti-reflective coating. Since the function of the partitioning layer is to prevent the direct contact between the organic anti-reflective coating and the inorganic anti-reflective coating, its thickness is not important. Typically, a thickness of about 50 Å would suffice.

BRIEF DESCRIPTION OF THE DRAWING

The present invention will be described in detail with reference to the drawing showing the preferred embodiment of the present invention, wherein:

FIGS. 1–6 are illustrative schematic drawings showing the main steps of forming a metal pattern on a wafer surface using the method disclosed in the present invention.

FIG. 1 is an illustrative schematic diagram showing that an inorganic anti-reflective coating is deposited on an aluminum layer, which is formed on a barrier layer.

FIG. 2 is an illustrative schematic diagram showing that an isolation layer is deposited on the inorganic anti-reflective coating.

FIG. 3 is an illustrative schematic diagram showing that a photoresist pattern is transferred to the wafer surface using an image transfer process after an organic anti-reflective coating is deposited on the isolation layer.

FIG. 4 is an illustrative schematic diagram showing that portions of the organic anti-reflective coating and the isolation layer are etched away by an oxide etcher using the photoresist pattern as the etching mask.

FIG. 5 is an illustrative schematic diagram showing that portions of the inorganic anti-reflective coating and the metal layer are etched away by a metal etcher also using the photoresist pattern as the etching mask.

FIG. 6 is an illustrative schematic diagram showing that a metal pattern is formed on the wafer surface after all the layers above the metal layer are removed.

DETAILED DESCRIPTION OF THE PREFERRED EMBODIMENT

Figure 1:
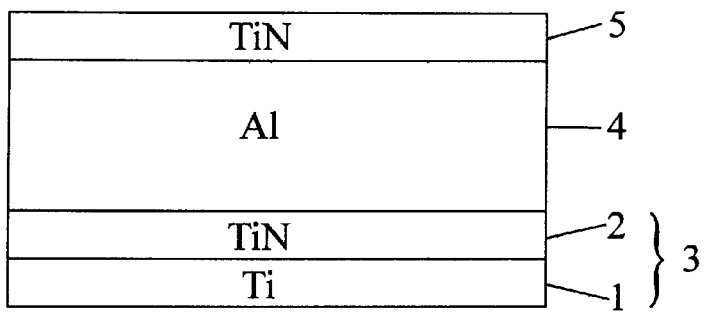

The present invention discloses a method which provides improvements in the precise patterning of photoresist in conjunction with the deep UV technology so as to allow the critical dimension of the photoresist layer, and consequently, that of the metal layer, to be further reduced. The method disclosed in the present invention can smoothen the advancement of sub-micron and deep sub-micron technology into the 0.25 µm, 0.20 µm, 0.18 µm, or even further advanced processes. The method disclosed in the present invention allows a combined anti-reflective coating to be used which contains both an organic anti-reflective film and an inorganic anti-reflective film, more particularly a TiN film, so as to enjoy the advantages of the combined anti-reflective coating while eliminating the production yield problems that have been observed when such combined anti-reflective coatings are utilized in the deep UV processes.

The inventors of the present invention have discovered that, when the combined organic and inorganic anti-reflective coatings are formed on a metal layer, an oxidized composition can be formed between the organic anti-reflective film and the inorganic anti-reflective film which cannot be easily etched away by the conventional oxide etcher or a metal etcher. As a result, a metal stringer can be formed from the metal line, causing the metal line to short. This problem has been identified to be a "yield killer" and is causing drawbacks against the use of the combined anti-reflective coatings.

In the process disclosed in the present invention, a partitioning layer is formed on top of the inorganic anti-reflective film prior to the deposition of the organic anti-reflective film. The partitioning layer is designed such that it will not react with the inorganic anti-reflective coating and that it can be easily removed by an oxide etcher or metal etcher. The partitioning layer serves to isolate the organic anti-reflective film from being in direct contact with the inorganic anti-reflective film. Unexpected results were observed in that production yield can be substantially improved. The dielectric isolation layer can be a silicon dioxide layer or a polymer layer which is different from the organic anti-reflective film.

More specifically, the present invention discloses an improved photolithography process which utilizes the deep UV technology with the aid of a composite anti-reflective coating to pattern the photoresist; it includes the following main steps:

(a) Depositing a Ti layer and a TiN layer to form a barrier layer;

(b) Depositing a metal layer, typically an aluminum layer;

(c) Depositing an inorganic anti-reflective layer, typically a TiN layer, on top of the aluminum layer;

(d) Depositing a partitioning layer on top of the TiN layer, the partitioning layer is deposited from a material that will not react with the TiN layer to form an immovable material;

(e) Depositing an organic anti-reflective layer on the dielectric film;

(f) Depositing a photoresist on the organic anti-reflective film;

(g) Performing an image transfer process using a deep UV technology in conjunction with a suitable photomask;

(h) Using a reactive-ion etching (RIE) technique and an oxide etcher to etch the organic anti-reflective film and the partitioning film not covered by the photoresist;

(i) Using a reactive ion etching technique and a metal etcher to etch the TiN and the metal layer also not covered by the photoresist; and (j) Removing all the layers above the metal layer to reveal a metal pattern and thus form a metal layer.

As discussed earlier, the partitioning layer should be made from a material that is inert with respect to the TiN layer, and a wide selection of materials can be used. The preferred examples are polymers, such as polyimides, which do not react with the inorganic anti-reflective coating. Since the function of the partitioning layer is to prevent the direct contact between the organic anti-reflective coating and the inorganic anti-reflective coating, its thickness is not important. Typically, a thickness of about 50 Å would suffice.

The present invention will now be described more specifically with reference to the following examples. It is to be noted that the following descriptions of examples, including the preferred embodiment of this invention, are presented herein for purposes of illustration and description, and are not intended to be exhaustive or to limit the invention to the precise form disclosed.

EXAMPLE 1

FIGS. 1–6 are illustrative schematic drawings showing the key steps of forming a metal pattern on a wafer surface according to a preferred embodiment of the method disclosed in the present invention.

In FIG. 1, it is shown that an aluminum layer 4 is deposited on top of barrier layer 3, which contains a TiN layer and a Ti layer. Subsequently, a TiN layer 5 is deposited on the aluminum layer 4 as an inorganic anti-reflective coating.

Figure 2:
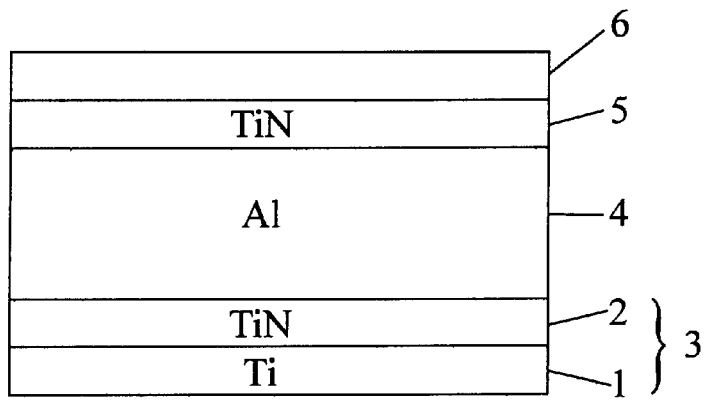
Figure 3:
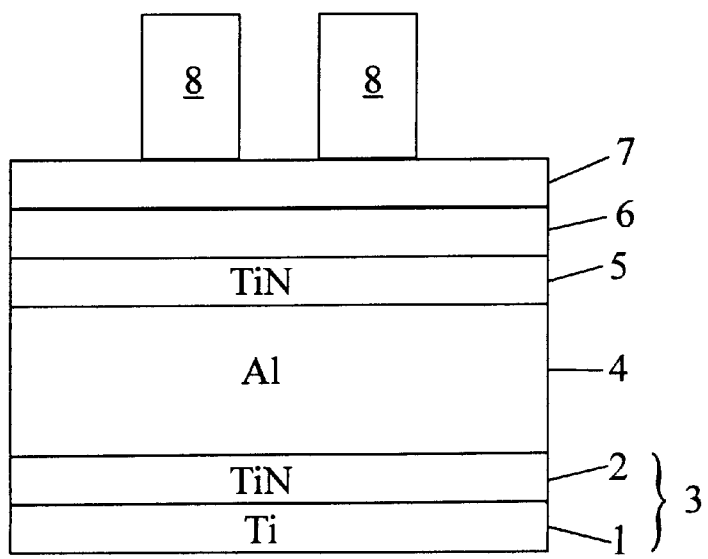

FIG. 2 shows that a partitioning layer 6 is deposited on top of the inorganic anti-reflective coating 5. The partitioning layer contains polyimide. FIG. 3 shows that an organic anti-reflective coating 7 is deposited on the isolation layer 6, then, a photoresist pattern 7 is formed on the partitioning layer 6 using a photolithography process utilizing the deep UV technology in conjunction with a photomask (not shown).

FIG. 4 shows that portions of the organic anti-reflective coating and the partitioning layer are etched away by an oxide etcher using the photoresist pattern as the etching mask. Preferably, the partitioning layer is selected such that it can be readily removed by the same oxide etcher used for removing the organic anti-reflective coating. FIG. 5 shows that portions of the inorganic anti-reflective coating and the metal layer are etched away by a metal etcher also using the photoresist pattern as the etching mask.

Finally, FIG. 6 shows that a metal pattern 10 is formed on the surface of the wafer 9 after all the layers above the metal layer 4 are removed.

The implementation of the partitioning layer between the organic and inorganic anti-reflective films effectively prevents the formation of the inter-film oxide layer. Thus the present invention eliminates the metal stringer formation problems that are experienced during the application of the deep UV technology when a combined anti-reflective coating is used. As a result, the present invention allows the critical dimension of the semiconductor devices to be further reduced without sacrificing production yield.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A process for fabricating a metal pattern on a wafer surface, comprising the steps of:

(a) depositing a metal layer on a wafer surface;

(b) depositing an inorganic anti-reflective layer on top of said metal layer;

(c) depositing a partitioning layer on top of said inorganic anti-reflective layer, said partitioning layer is deposited from a first organic material that will not react with said inorganic anti-reflective layer to form an immovable material;

(d) depositing an organic anti-reflective layer on said partitioning layer, said photoresist being of a third organic material different from said first and second material;

(e) depositing a photoresist on said organic anti-reflective layer;

(f) performing a photolithography process to form a photoresist pattern using a deep UV technology in conjunction with a photomask;

(g) removing said organic anti-reflective layer and said partitioning layer not covered by the photoresist using an oxide etcher;

(h) removing said inorganic anti-reflective layer and said metal layer also not covered by the photoresist using a metal etcher; and (i) removing all the layers above said metal layer to reveal a metal pattern.

2. The process for fabricating a metal pattern on a wafer surface according to claim 1, wherein said metal layer is an aluminum layer.

3. The process for fabricating a metal pattern on a wafer surface according to claim 1 which further comprises the steps of depositing a barrier layer on the wafer surface before the deposition of the metal layer, wherein said barrier layer comprises a titanium layer and, on top of the titanium layer, a TiN layer.

4. The process for fabricating a metal pattern on a wafer surface according to claim 1 wherein said inorganic anti-reflective layer is a TiN layer.

5. The process for fabricating a metal pattern on a wafer surface according to claim 1 wherein said partitioning layer is deposited from a polymer material which does not react with said inorganic anti-reflective layer.

6. The process for fabricating a metal pattern on a wafer surface according to claim 1 wherein said inorganic layer comprises at least one material selected from the group consisting of TiN, $Si_3N_4$, and TiW.

7. The process for fabricating a metal pattern on a wafer surface according to claim 1 wherein said organic anti-reflective layer is deposited from a anti-reflective polymer material.

8. A process for forming an anti-reflective coating on a metal layer in the fabrication of sub-micron or deep sub-micron semiconductor devices on a wafer surface, comprising the steps of:
  (a) depositing an inorganic anti-reflective layer on top of a metal layer which has been formed on a wafer surface;
  (b) depositing a partitioning layer on top of said inorganic anti-reflective layer, said partitioning layer is deposited from a first organic material that will not react with said inorganic anti-reflective layer to form an immovable material; and
  (c) depositing an organic anti-reflective layer on said partitioning layer, said organic anti-reflective layer being of a second organic material, different from said first material;
  (d) wherein said partitioning layer, which separates said organic anti-reflective layer from said inorganic anti-reflective layer, prevents a reaction between said organic anti-reflective layer from said inorganic anti-reflective layer, depositing a photoresist on said organic anti-reflective layer, said photoresist being of a third organic material different from said first and second materials; a2 said organic anti-reflective layer being of a second organic material, different from said first material.

9. The process for forming an anti-reflective coating on a metal layer according to claim 8, wherein said metal layer is an aluminum layer.

10. The process for forming an anti-reflective coating on a metal layer according to claim 8 wherein said inorganic anti-reflective layer is a TiN layer.

11. The process for forming an anti-reflective coating on a metal layer according to claim 8 wherein said partitioning layer is deposited from a polymer material which does not react with said inorganic anti-reflective layer.

12. The process for forming an anti-reflective coating on a metal layer according to claim 8 wherein said inorganic layer comprises at least one material selected from the group consisting of TiN, $Si_3N_4$, and TiW.

13. The process for forming an anti-reflective coating on a metal layer according to claim 8 wherein said organic anti-reflective layer is deposited from a anti-reflective polymer material.

14. A process for fabricating a sub-micron or deep sub-micron semiconductor device on a wafer surface, comprising the steps of:
  (a) depositing a metal layer on a wafer surface;
  (b) depositing an inorganic anti-reflective layer on top of said metal layer;
  (c) depositing a partitioning layer on top of said inorganic anti-reflective layer, said partitioning layer is deposited from a material first organic that will not react with said inorganic anti-reflective layer to form an immovable material;
  (d) depositing an organic anti-reflective layer on said partitioning layer said organic anti-reflective layer being of a second organic material, different from said first material;
  (e) depositing a photoresist on said organic anti-reflective layer, said photoresist being of a third organic material different from said first and second materials;
  (f) performing a photolithography process to form a photoresist pattern using a deep UV technology in conjunction with a photomask;
  (g) removing said organic anti-reflective said and said partitioning layer not covered by the photoresist using an oxide etcher;
  (h) removing said inorganic anti-reflective layer and said metal layer also not covered by the photoresist using a metal etcher; and
  (i) removing all the layers above said metal layer to reveal a metal pattern.

15. The process for fabricating a sub-micron or deep sub-micron semiconductor device on a wafer surface according to claim 14, wherein said metal layer is an aluminum layer, and said inorganic anti-reflective layer is a TiN layer.

* * * * *